United States Patent
McGlew

(10) Patent No.: US 9,784,967 B2
(45) Date of Patent: Oct. 10, 2017

(54) SUPPRESSION OF UNDESIRED HARMONICS IN MEMS MIRROR PROJECTOR DISPLAY

(71) Applicant: INTEL CORPORATION, Santa Clara, CA (US)

(72) Inventor: Patrick Gerard McGlew, Romainmotier (CH)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/977,511

(22) Filed: Dec. 21, 2015

(65) Prior Publication Data

US 2017/0102536 A1  Apr. 13, 2017

Related U.S. Application Data

(60) Provisional application No. 62/240,384, filed on Oct. 12, 2015.

(51) Int. Cl.
| | |
|---|---|
| *G02B 26/08* | (2006.01) |
| *B81B 3/00* | (2006.01) |
| *G02B 26/10* | (2006.01) |
| *G02B 27/01* | (2006.01) |
| *H04N 9/31* | (2006.01) |

(52) U.S. Cl.
CPC ........ *G02B 26/0833* (2013.01); *B81B 3/0045* (2013.01); *G02B 26/101* (2013.01); *G02B 27/0176* (2013.01); *H04N 9/3135* (2013.01); *B81B 2201/042* (2013.01); *G02B 2027/0154* (2013.01)

(58) Field of Classification Search
CPC ............ G02B 26/0833; G02B 26/0841; G02B 26/085; G02B 26/0855; G02B 26/0858; G02B 26/101; G02B 27/0176; G02B 2027/0154; B81B 3/0045; B81B 2201/042; H04N 9/3135
USPC ...................... 359/198.1–199.4, 200.6–200.8, 359/213.1–214.1, 221.2, 224.1–224.2, 298
See application file for complete search history.

(56) References Cited

U.S. PATENT DOCUMENTS

| | | | |
|---|---|---|---|
| 2005/0194922 A1 | 9/2005 | Hagen | |
| 2008/0266627 A1* | 10/2008 | Brown | G02B 7/1821 359/198.1 |
| 2009/0212203 A1 | 8/2009 | Gibson et al. | |
| 2011/0141441 A1 | 6/2011 | Konmo et al. | |
| 2013/0100098 A1 | 4/2013 | Shen et al. | |
| 2015/0226556 A1 | 8/2015 | Aaltonen | |

OTHER PUBLICATIONS

International Search Report and Written Opinion received for PCT Patent No. PCT/US2016/055054, mailed Dec. 15, 2016, 10 pages.

* cited by examiner

*Primary Examiner* — James Phan

(57) ABSTRACT

Disclosed herein are devices and methods to generate a drive signal to actuate a MEMS mirror system. A controller can generate the drive signal to comprise a modified square wave voltage waveform comprising a tri-stated portion, an attenuated portion, or a tri-stated and an attenuated portion to suppress a number of harmonics in a response of the MEMS mirror system to the drive signal.

25 Claims, 17 Drawing Sheets

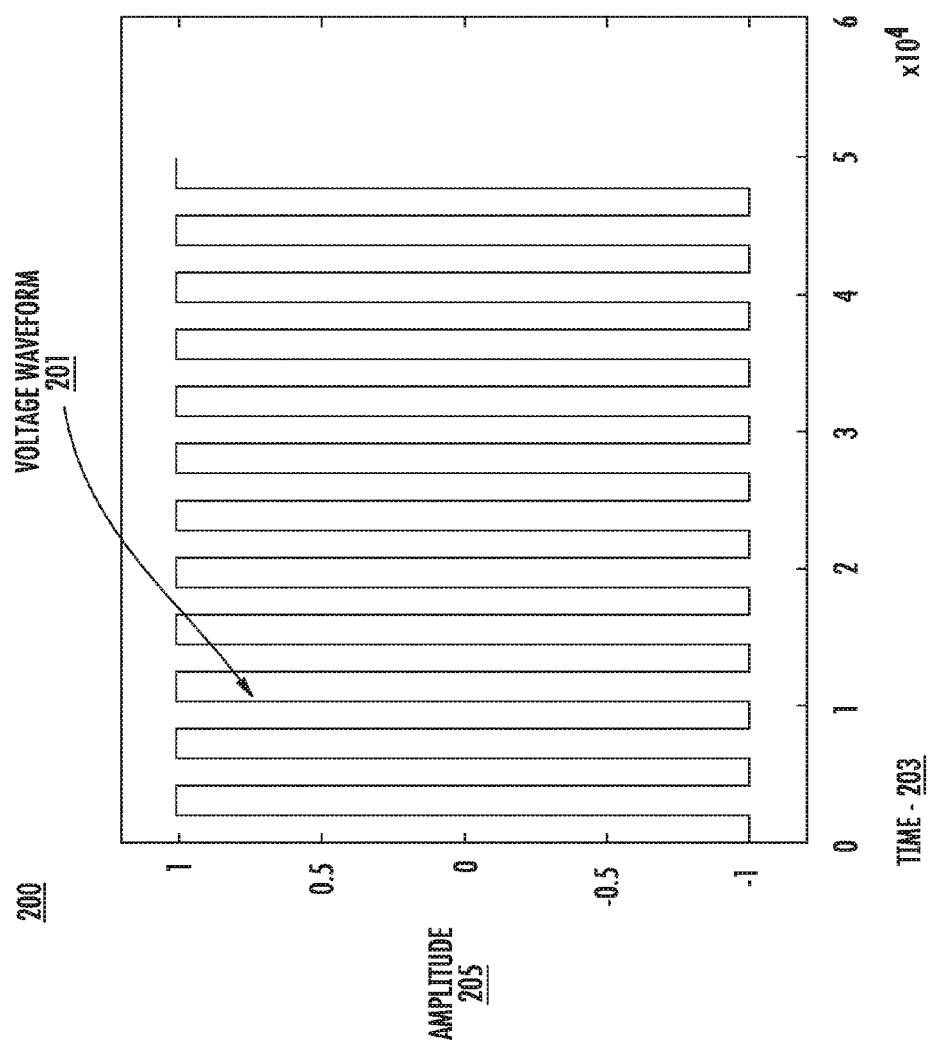

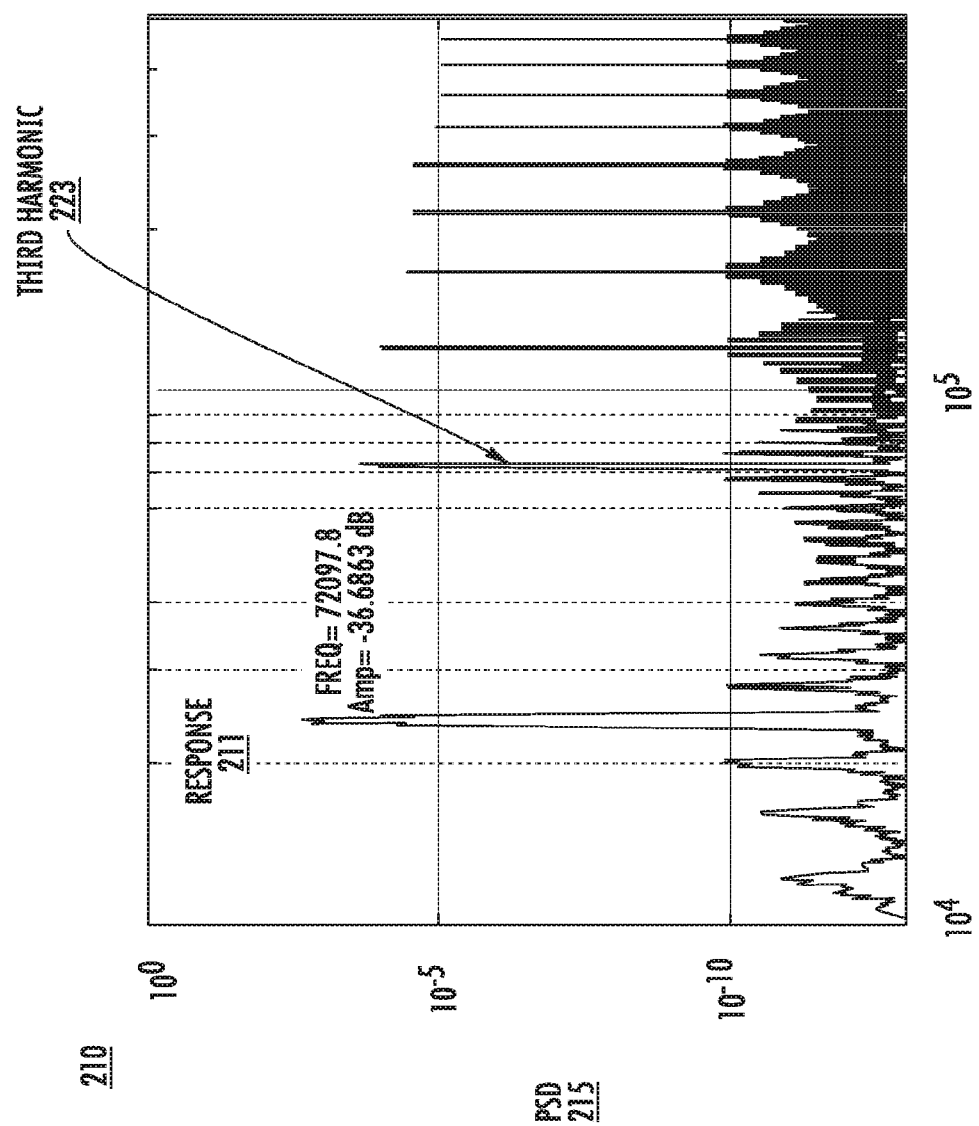

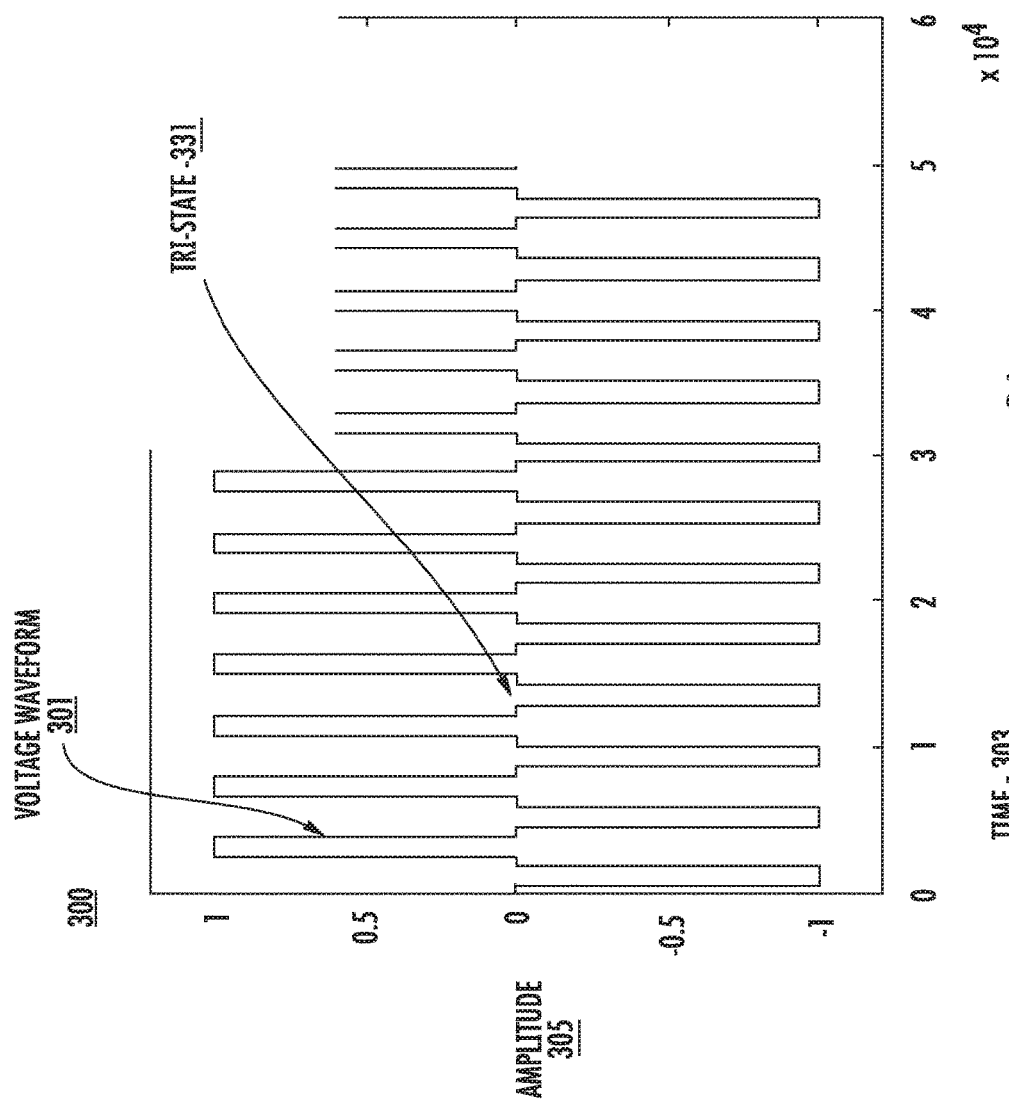

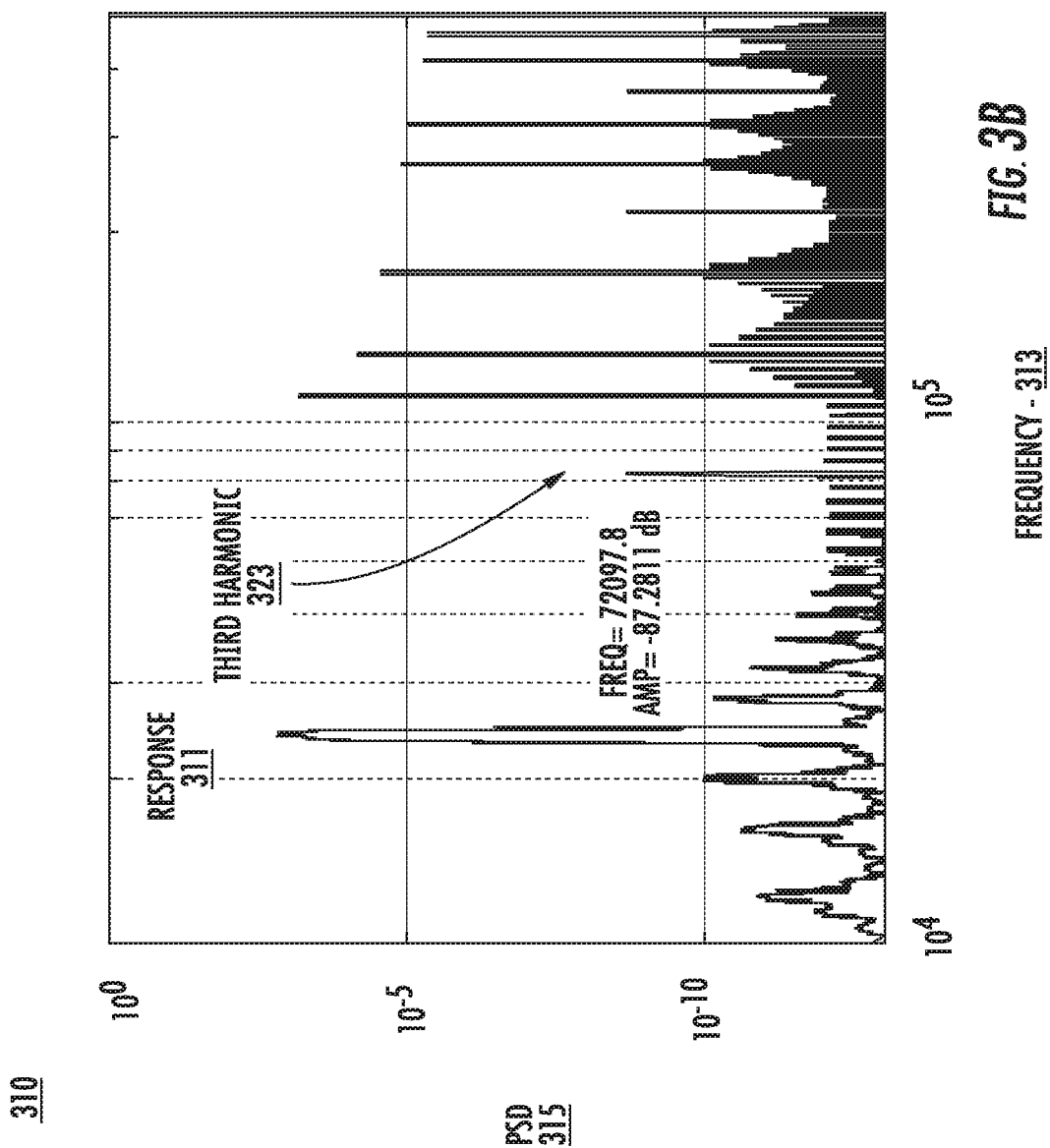

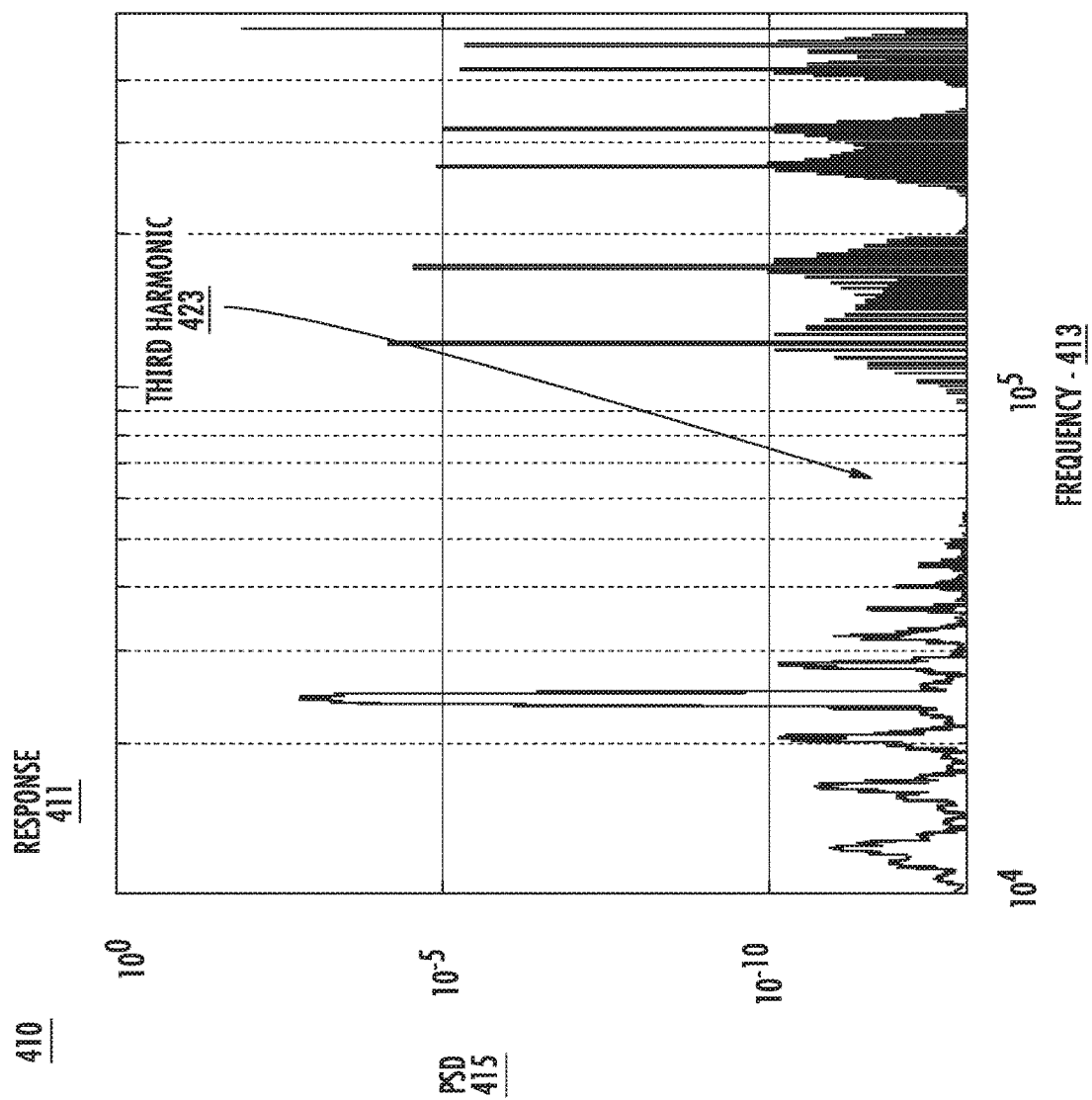

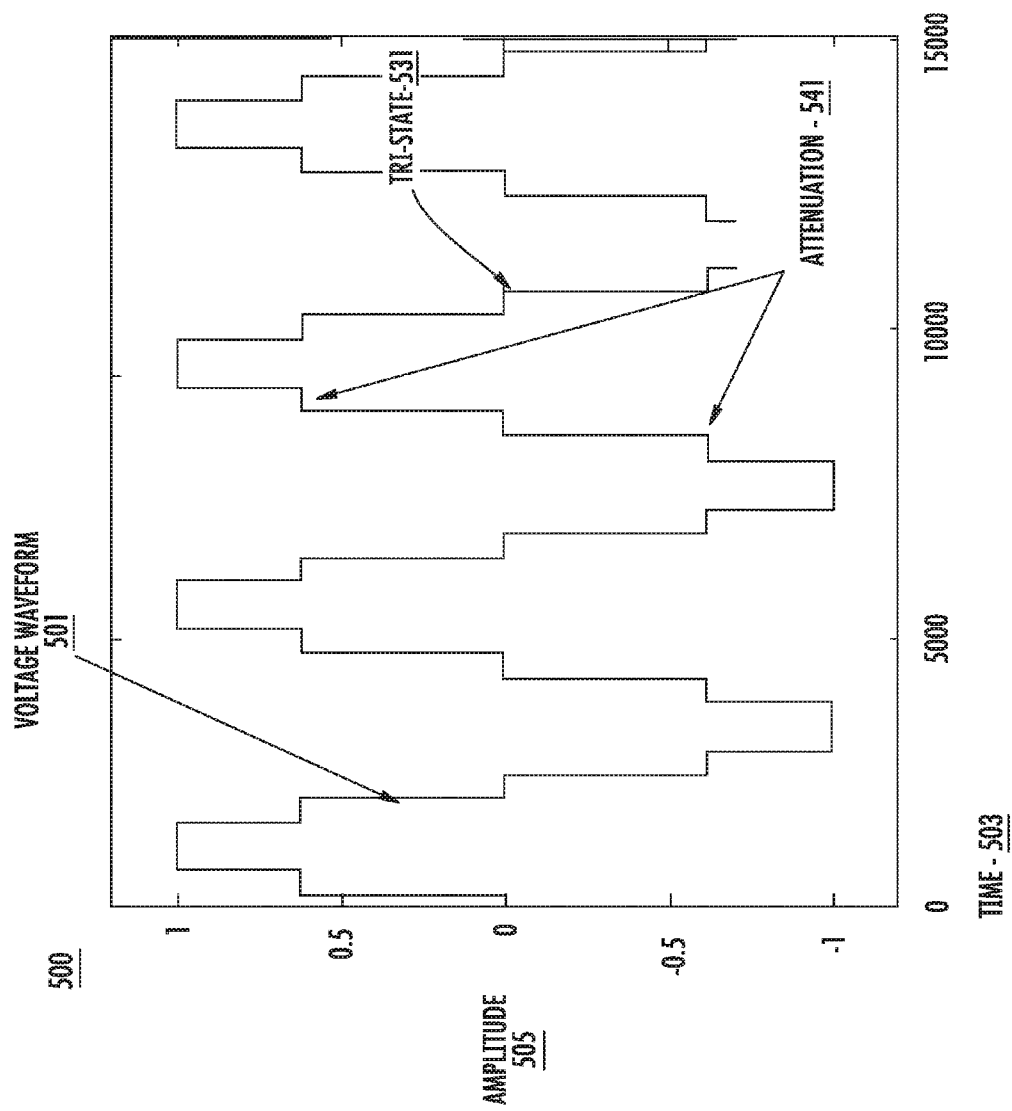

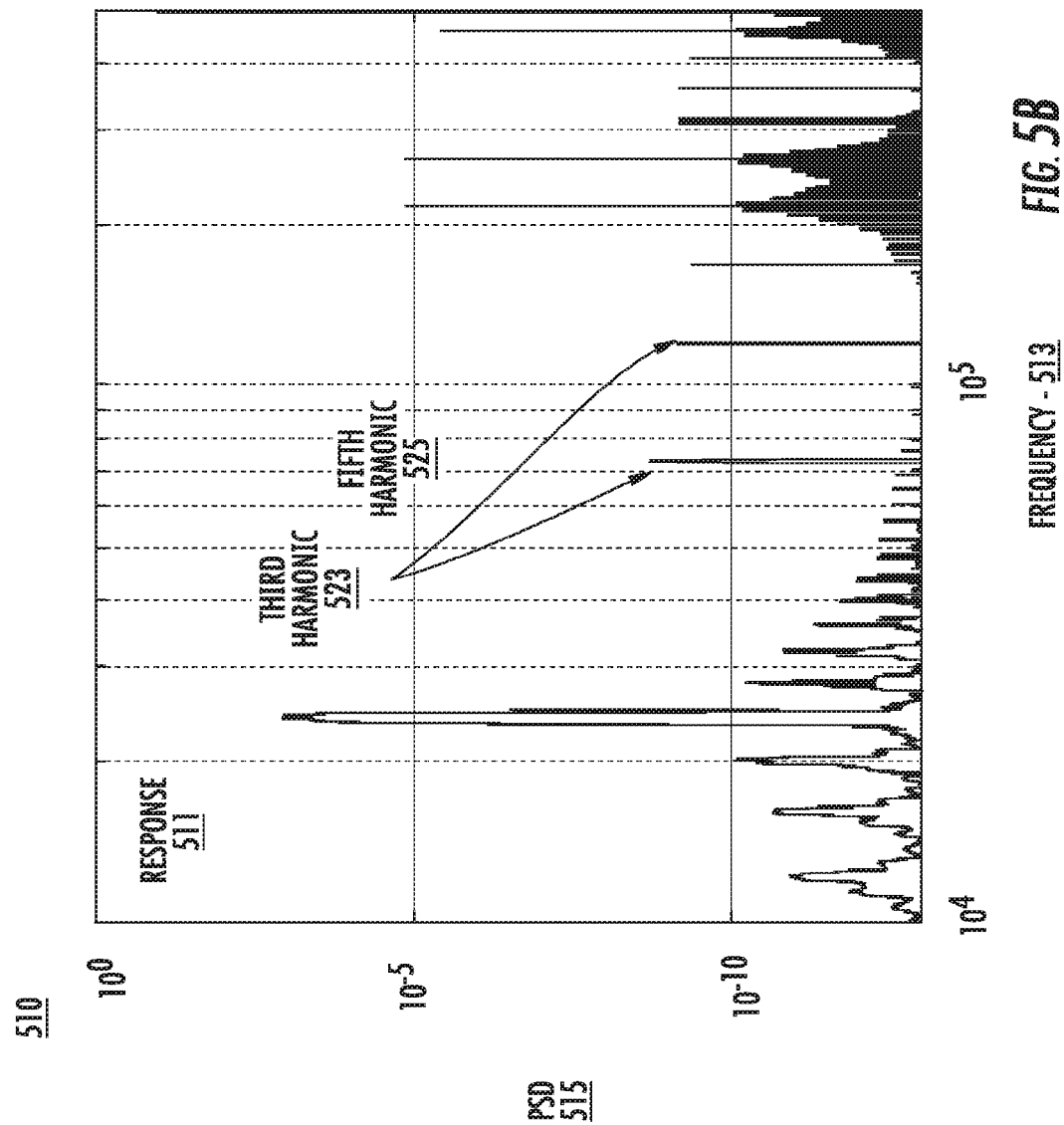

1100

GENERATE A DRIVE SIGNAL TO INCLUDE A MODIFIED
SQUARE WAVE VOLTAGE WAVEFORM
1110

APPLY THE DRIVE SIGNAL TO A MEMS MIRROR SYSTEM TO
ACTUATE THE MEMS MIRROR SYSTEM
1120

SUPPRESSION OF UNDESIRED HARMONICS IN MEMS MIRROR PROJECTOR DISPLAY

CROSS-REFERENCE TO RELATED APPLICATION

This application claims the benefit of U.S. Provisional Application Ser. No. 62/240,384 filed Oct. 12, 2015, entitled "Suppression of Undesired Harmonics in MEMS Mirror Projector Display," which application is incorporated herein by reference in its entirety.

TECHNICAL FIELD

Embodiments herein generally relate to controllers and control routines for motors and in particular to suppressing harmonics in the resonance axis for a microelectromechanical system (MEMS) mirror.

BACKGROUND

Modern display technology may be implemented to provide a head worn display (HWD) or a heads up display (HUD). Such HWDs and/or HUDs can be implemented to provide a display of a virtual image (e.g., images, text, or the like). The virtual image may be provided in conjunction with a real world view. Such HWDs and/or HUDs can be implemented in a variety of contexts, for example, defense, transportation, industrial, entertainment, wearable devices, or the like.

Many HWD and/or HUD systems use a microelectromechanical system (MEMS) mirror to reflect light to a projection surface. Conventionally, HWD and/or HUD systems have extremely difficult tradeoffs between various design and utility considerations, such as, for example, bulk and form-factor versus image quality and power consumption.

BRIEF DESCRIPTION OF THE DRAWINGS

FIGS. 2A-2B illustrate a first example voltage waveform and a first example MEMS mirror system response to the first example voltage waveform.

FIGS. 3A-3B illustrate a second example voltage waveform and a second example MEMS mirror system response to the second example voltage waveform.

FIGS. 4A-4B illustrate a third example voltage waveform and a third example MEMS mirror system response to the third example voltage waveform.

FIGS. 5A-5B illustrate a fourth example voltage waveform and a fourth example MEMS mirror system response to the fourth example voltage waveform.

DETAILED DESCRIPTION

Figure 1:
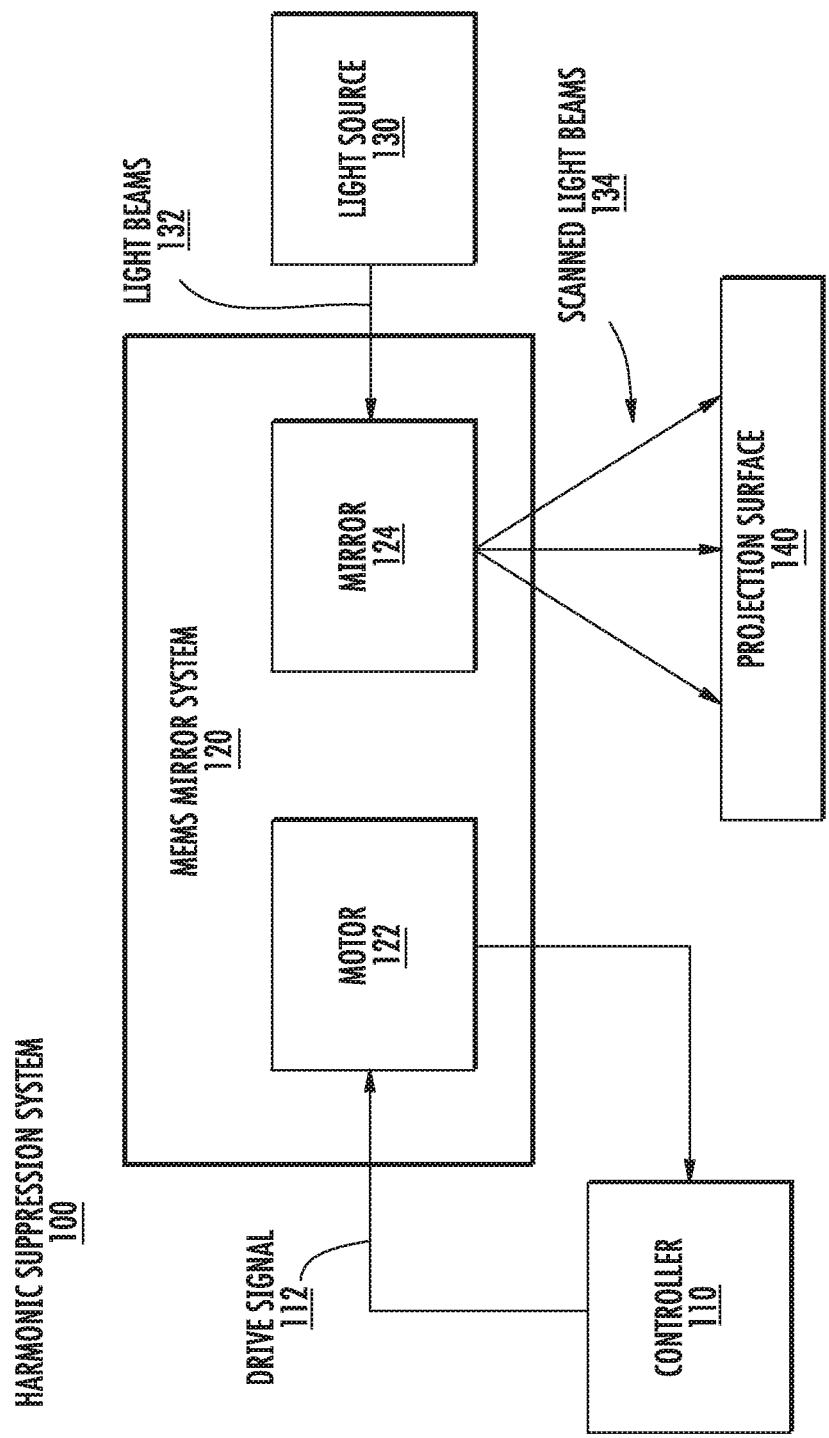
FIG. 1 illustrates an example system.

Various examples are generally directed to drive controllers, drive assemblies, mirror assemblies, and wearable displays. Various examples are generally directed to control routines for drive controllers and mirror assemblies of a head worn display (HWD) or a heads up display (HUD). In particular, the present disclosure provides drive assemblies and controllers to suppress undesired harmonics in driving the resonant axis of a microelectromechanical (MEMS) mirror for a HWD and/or HUD.

In general, the present disclosure provides to generate a drive signal to actuate a MEMS mirror system, the drive signal to comprise a modified square wave voltage waveform to suppress a number of harmonics of a response of the MEMS mirror system to the actuation based on the drive signal. In particular, the present disclosure provides to tri-state and/or attenuate portions of a periodic square wave voltage waveform to generate the drive signal.

In some examples, a controller including a current source and a switching assembly to generate the drive signal can be provided. Additionally, a MEMS mirror system can be provided. During operation, the controller can generate the drive signal to actuate the MEMS mirror system. With some examples, the controller and MEMS mirror system can be implemented in a HWD or a HUD. Examples are not limited in these contexts.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, known structures and devices are shown in block diagram form in order to facilitate a description thereof. The intention is to provide a thorough description such that all modifications, equivalents, and alternatives within the scope of the claims are sufficiently described.

Additionally, reference may be made to variables, such as, "a", "b", "c", which are used to denote components where more than one component may be implemented. It is important to note, that there need not necessarily be multiple components and further, where multiple components are implemented, they need not be identical. Instead, use of variables to reference components in the figures is done for convenience and clarity of presentation.

FIG. 1 illustrates a block diagram of an example harmonic suppression system 100, arranged according to examples of the present disclosure. The harmonic suppression system 100 may include one or more of a controller 110, a MEMS mirror system 120. The MEMS mirror system 120 includes a motor 122 and a mirror 124. In general, during operation, the controller 110 can generate a drive signal 112 to actuate the motor 122, which in turn, actuates the mirror 124. Upon actuation, the mirror 124 rotates about at least one axis.

In some examples, the harmonic suppression system 100 can include at least one of a light source 130 or a projection surface 140. During operation, the light source 130 emits light beams 132, which are received by the mirror 124. The motor 122 actuates the mirror 124 to rotate about at least one axis to reflect and scan the light beams 132 across the projection surface 140, indicated as scanned light beams 134. It is worthy to note, that the harmonic suppression system 100 can be implemented without either of the light source 130 and/or the projection surface 140. Said differently, the harmonic suppression system 100 can be provided to suppress harmonics as described herein, while a light source and/or a projection surface can be provided by a system integrator, a user, or the like. Examples are not limited in this context.

It is worthy to note, the motor 122 and mirror 124 are depicted as separate blocks in the MEMS mirror system 120 for purposes of convenience and clarity in discussing the present disclosure. However, in many implementations, the motor 122 and mirror 124 may be implemented in conjunction with each other. Said differently, the motor 122 and mirror 124 may comprise a unified assembly. In some examples, the motor 122 may be a conductive coil, or wire, operably coupled to the mirror 124. During operation, the controller 110 may apply an electric current to the conductive coil (e.g., the motor 122) to deform or move the mirror 124 to oscillate the mirror about at least one axis. In some examples, the motor may be magnetically actuated, peizoelectrically actuated, or the like.

The controller 110 can be operably coupled to the motor 122 and configured to "drive" the motor via a drive signal 112. In general, the controller 110 may generate the drive signal 112 and apply the drive signal to the motor 122 to actuate the MEMS mirror system 120. In some examples, the drive signal 112 can be composed of a modified square wave voltage waveform. These example modified square waves are described in detail below. However, in general, the modified square waves suppress, or reduce, a harmonic motion of the mirror 124. It is worthy to note, during operation, the mirror 124 oscillates periodically. The periodic motion of the mirror 124 can manifest in undesirable visual effects in the scanned light beams 134. This is described in greater detail below.

Figure 10:
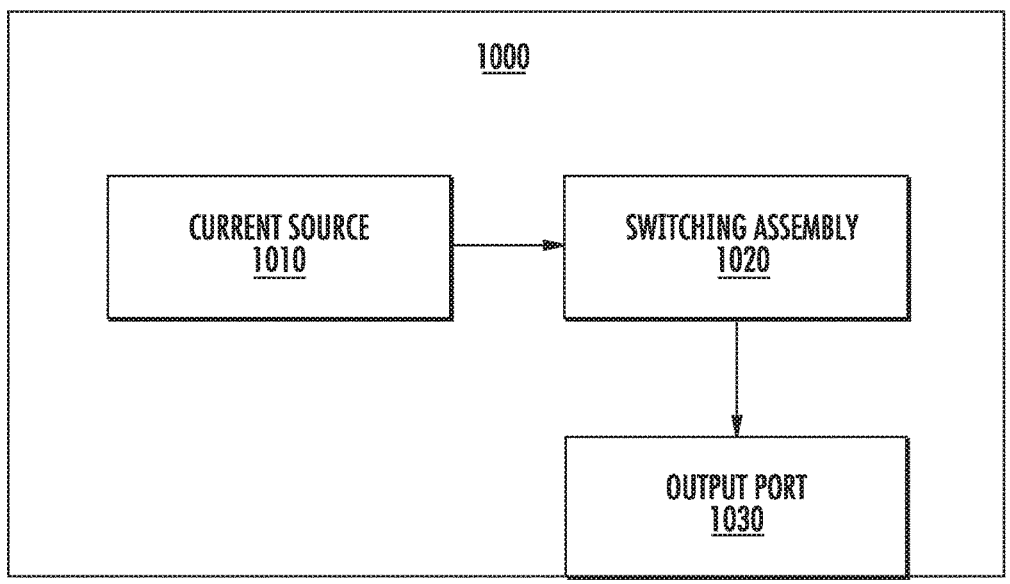
FIG. 10 illustrates an example controller to generate a drive signal to actuate a MEMS mirror system.

In general, the controller 110 comprise a current source and a number of switches (e.g., refer to FIG. 10). For example, the controller 110 can comprise a current source and an H-Bridge, a Tri-State, or another configuration of switches to generate a modified square wave as described herein.

In some examples, the mirror 124 may be configured to rotate about one axis. Accordingly, the controller 110 may generate the drive signal 112 to actuate the motor 122 and cause the mirror to rotate about the one axis. In some examples, the mirror 124 may be configured to rotate about a number of axes, such as, two (often referred to as a 2D mirror). In general, where the mirror 124 is a 2D mirror, it may rotate about a first one of the two axes at a faster rate than it rotates about a second one of the two axes. These axes can be referred to as the "fast axis" and the "slow axis."

With some examples, the controller 110 can be generate multiple drive signals 112. In particular, the controller 112 can generate a drive signal for each of the axis in which the mirror 124 rotates. With some examples, the controller 110 can generate the drive signal 112 to include a modified square wave as described herein to control one of the axis of rotation of a 2D mirror. In some examples, the controller 110 can generate the drive signal 112 to include a modified square wave to actuate the motor 122 and cause the mirror 124 to rotate about the slow axis. In some examples, the controller 110 can generate the drive signal 112 to include a modified square wave to actuate the motor 122 and cause the mirror 124 to rotate about the fast axis.

The controller 110 generates the drive signal 112 to actuate the MEMS mirror system 120. In general, the drive signal comprises a modified square wave. For example, the controller can generate the drive signal to comprise a square wave where at least one of the harmonics of the square wave is suppressed. For example, the controller can generate a square wave and can tri-state (e.g., refer to FIG. 3A or 5A) and/or attenuate (e.g., refer to FIG. 4A or 5A) to reduce a number of harmonics in the square wave voltage signal (e.g., refer to FIG. 3B, 4B, 5B, 6, or 7). This is explained in greater detail below.

In general, the light source 130 can be any of a variety of light sources to emit light beams 132. For example, the light source 130 can be a laser light source, a light emitting diode (LED) light source, or the like.

In general, the projection surface can be any of a variety of projection surfaces to receive the scanned light beams 134 and display an image. In some examples, the image may be a virtual image. More particularly, with some examples, the projection surface can be a holographic optical element to receive the scanned light beams 134 and diffract and reflect the scanned light beams to an exit pupil to display a virtual image for a user. Examples are not limited in this context.

In some examples, the harmonic suppression system 100 can be implemented as a HWD. For example, the harmonic suppression system 100 can be implemented as a pair of glasses, as a visor, as a helmet, as googles, or the like. In some examples, the harmonic suppression system 100 can be implemented as a HUD. For example, the harmonic suppression system 100 can be implemented as a windshield, or the like.

In some examples, the harmonic suppression system 100 can include a variety of other components necessary to form a unified HWD or HUD. For example, the harmonic suppression system 100 can include a battery, a user interface, audible input and/or output devices, a frame coupled to the components, or the like.

Figure 4A:
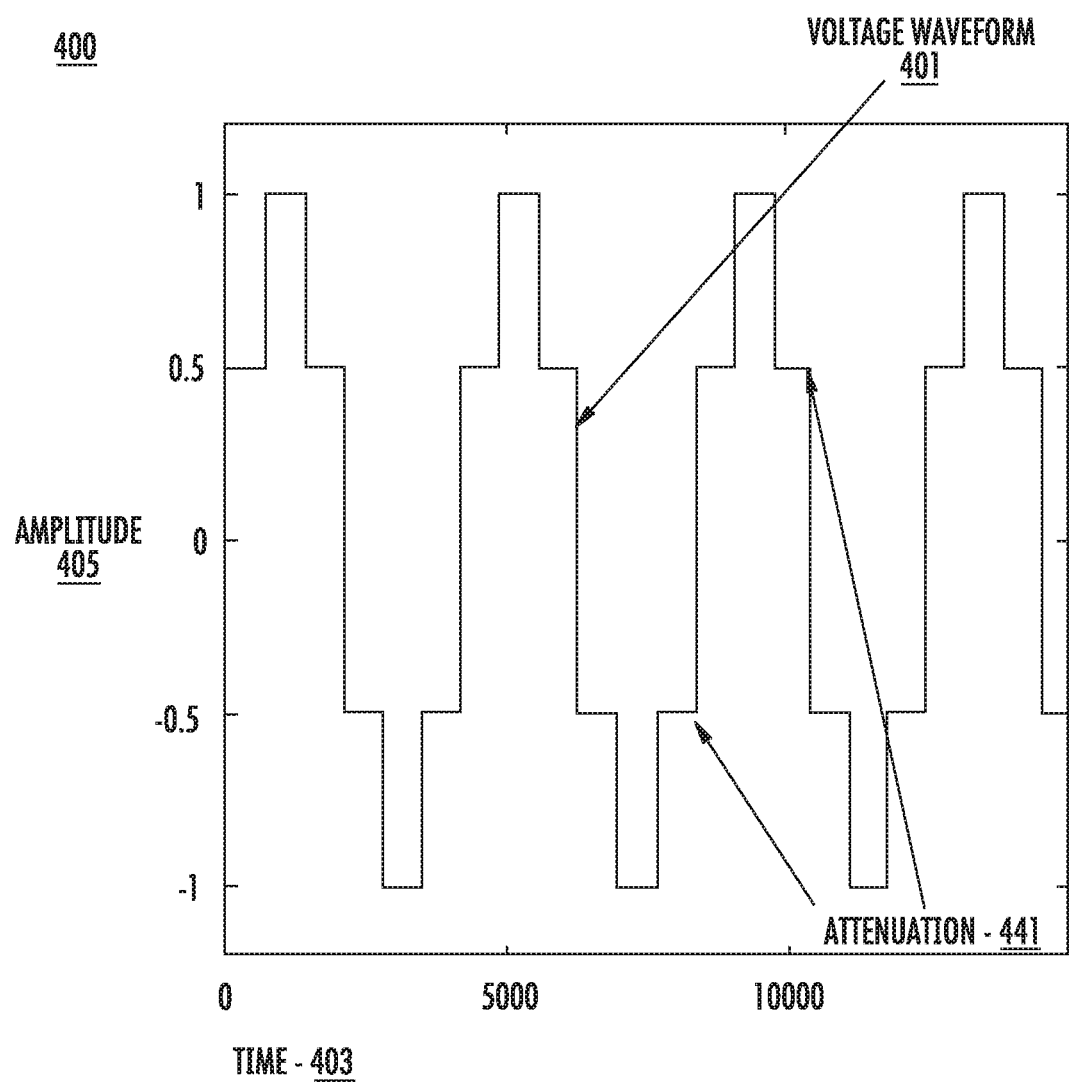

FIGS. 2A-2B, 3A-3B, 4A-4B, and 5A-5B each illustrate an example voltage waveform of a drive signal and a corresponding resonant response of a MEM mirror system to actuation based on the voltage waveform. In particular, FIG. 2A illustrates an example square wave drive signal and FIG. 2B illustrates a corresponding resonant response while FIGS. 3A, 4A, and 5A illustrates example modified square wave drive signals and FIGS. 3B, 4B, and 5B illustrates corresponding example resonant responses, respectively.

Turning more particularly to FIG. 2A, plot 200 is illustrated. The plot 200 depicts a voltage waveform 201 is depicted using amplitude in volts 205 on the y-axis and time in seconds 203 on the x-axis. During operation, the controller 110 can generate the drive signal 112 to comprise the voltage waveform 201, which may actuate the MEMS mirror system 120. Rotation of the mirror 124 due to actuation by the voltage waveform 201 may result in a variety of harmonics (e.g., refer to FIG. 2B). As illustrated, the voltage waveform 201 periodically changes amplitude (e.g., y axis). In particular, over time (e.g., x axis) the voltage waveform 201 may switch from a positive 1-volt amplitude to a negative 1-volt amplitude.

Turning more particularly to FIG. 2B, the plot 210 is illustrated. The plot 210 depicts a response 211. The response 211 is depicted using PSD 215 in decibels (db) on the y-axis and frequency in Hertz 213 on the x-axis. The response 211 may correspond to a response of the MEMS mirror system 120 to actuation by the voltage waveform 201. In particular, the mirror 124 may resonate as a function of frequency 213, which can be represented as the PSD 215. It is worthy to note, that the response 211 includes a third harmonic 223, at approximately 72,097.8 Hz which has an approximately −36.6863 dB amplitude.

Turning more particularly to FIG. 3A, plot 300 is illustrated. The plot 300 depicts a voltage waveform 301 using amplitude in volts 305 on the y-axis and time in seconds 303 on the x-axis. In some examples, the voltage waveform 301 can be referred to as a modified square wave. In some examples, the drive signal 112 can comprise the voltage waveform 301. During operation, the controller 110 can generate the drive signal 112 to comprise the voltage waveform 301, which may actuate the MEMS mirror system 120. Rotation of the mirror 124 due to actuation by the voltage waveform 301 may result in a variety of harmonics (e.g., refer to FIG. 3B). As illustrated, the voltage waveform 301 periodically changes amplitude (e.g., y axis). In particular, over time (e.g., x axis) the voltage waveform 301 may switch from a positive 1-volt amplitude to a negative 1-volt amplitude. However, as illustrated, the modified square wave 301 includes a "tri-state" where the amplitude is 0 for a period of time. In particular, the amplitude of the voltage waveform 301 is 0 for a period of time in between switching from a positive 1-volt amplitude to a negative 1-volt amplitude.

Turning more particularly to FIG. 3B, the plot 310 is illustrated. The plot 310 depicts a response 311. The response 311 is depicted using PSD 315 in decibels (db) on the y-axis and frequency in Hertz 313 on the x-axis. The response 311 may correspond to a response of the MEMS mirror system 120 to actuation by the voltage waveform 301. In particular, the mirror 124 may resonate as a function of frequency 313, which can be represented as the PSD 315. It is worthy to note, the response 311 includes a third harmonic 323, at approximately 72,097.8 Hz which has an approximately −87.2811 dB amplitude.

It is worthy to note, the amplitude of the third harmonic 323 is suppressed (e.g., less than) the amplitude of the third harmonic 223. Said differently, the third harmonic of the response of the MEMS mirror system 120 to actuation based on the voltage waveform 301 is suppressed relative to the third harmonic of the response of the MEMS mirror system 120 to actuation based on the voltage waveform 201. This is significant in that, the controller 110 may be implemented using, for example, simple current generation and switching components needed to generate a square wave. However, the controller 110 can still generate a drive signal 112 to attenuate, and thereby suppress, problematic harmonics within the MEM mirror system 120. It is also worthy to note, suppressing one harmonic (e.g., the third harmonic 323, or the like) may suppress that harmonics multiples. For example, suppressing the third harmonic may also suppress the ninth harmonic, as illustrated in the difference between the response 211 (e.g., FIG. 2B) and the response 311 (e.g., FIG. 3B).

Turning more particularly to FIG. 4A, plot 400 is illustrated. The plot 400 depicts a voltage waveform 401 using amplitude in volts 405 on the y-axis and time in seconds 403 on the x-axis. In some examples, the voltage waveform 401 can be referred to as a modified square wave. In some examples, the drive signal 112 can comprise the voltage waveform 401. During operation, the controller 110 can generate the drive signal 112 to comprise the voltage waveform 401, which may actuate the MEMS mirror system 120. Rotation of the mirror 124 due to actuation by the voltage waveform 401 may result in a variety of harmonics (e.g., refer to FIG. 4B). As illustrated, the voltage waveform 401 periodically changes amplitude (e.g., y axis). In particular, over time (e.g., x axis) the voltage waveform 401 may switch from a positive 1-volt amplitude to a negative 1-volt amplitude. However, as illustrated, the modified square wave 401 includes attenuated portions 441. In some examples, the controller 110 can generate the voltage waveform 401 to include the attenuated portions 441 based in part on applying a parallel shunt resistance in parallel with the driven circuit (e.g., the motor 122, or the like) for part of the period of the voltage waveform 401.

Turning more particularly to FIG. 4B, the plot 410 is illustrated. The plot 410 depicts a response 411. The response 411 is depicted using PSD 415 in decibels (db) on the y-axis and frequency in Hertz 413 on the x-axis. The response 411 may correspond to a response of the MEMS mirror system 120 to actuation by the voltage waveform 401. In particular, the mirror 124 may resonate as a function of frequency 413, which can be represented as the PSD 415. It is worthy to note, the response 411 includes a third harmonic 423, which is substantially entirely suppressed relative to the harmonics in the response 211.

It is worthy to note, the amplitude of the third harmonic 423 is suppressed (e.g., less than) the amplitude of the third harmonic 223. Said differently, the third harmonic of the response of the MEMS mirror system 120 to actuation based on the voltage waveform 401 is suppressed relative to the third harmonic of the response of the MEMS mirror system 120 to actuation based on the voltage waveform 201. This is significant in that, the controller 110 may be implemented using, for example, simple current generation and switching components needed to generate a square wave. However, the controller 110 can still generate a drive signal 112 to attenuate, and thereby suppress, problematic harmonics within the MEM mirror system 120. It is also worthy to note, suppressing one harmonic (e.g., the third harmonic 323, or the like) may suppress that harmonics multiples. For example, suppressing the third harmonic may also suppress the ninth harmonic, as illustrated in the difference between the response 211 (e.g., FIG. 2B) and the response 411 (e.g., FIG. 4B).

Turning more particularly to FIG. 5A, plot 500 is illustrated. The plot 500 depicts a voltage waveform 501 using amplitude in volts 505 on the y-axis and time in seconds 503 on the x-axis. In some examples, the voltage waveform 501 can be referred to as a modified square wave. In some examples, the drive signal 112 can comprise the voltage waveform 501. During operation, the controller 110 can generate the drive signal 112 to comprise the voltage waveform 501, which may actuate the MEMS mirror system 120. Rotation of the mirror 124 due to actuation by the voltage waveform 501 may result in a variety of harmonics (e.g., refer to FIG. 5B). As illustrated, the voltage waveform 501 periodically changes amplitude (e.g., y axis). In particular, over time (e.g., x axis) the voltage waveform 501 may switch from a positive 1-volt amplitude to a negative 1-volt amplitude. However, as illustrated, the modified square wave 501 includes tri-stated portions 531 and attenuated portions 541.

Turning more particularly to FIG. 5B, the plot 510 is illustrated. The plot 510 depicts a response 511. The response 511 is depicted using PSD 515 in decibels (db) on the y-axis and frequency in Hertz 513 on the x-axis. The response 511 may correspond to a response of the MEMS mirror system 120 to actuation by the voltage waveform 501. In particular, the mirror 124 may resonate as a function of frequency 513, which can be represented as the PSD 515. It is worthy to note, the response 511 includes a third harmonic 523 and a fifth harmonic 525, which are substantially suppressed relative to the harmonics in the response 211 (e.g., FIG. 2B).

In some examples, the controller 110 can generate a drive signal 112 to reduce a specific harmonic in the response of the MEMS mirror system 120. For example, the controller 110 can generate a drive signal 112 comprising a voltage waveform with a tri-state and/or attenuation (e.g., the voltage waveform 301 with the tri-state 331, the voltage waveform 401 with the attenuation 441, the voltage waveform 501 with the tri-state 531 and the attenuation 541, or the like) configured to suppress a particular harmonic. Additional example responses for suppressed harmonics are given below with respect to FIGS. 6-7 below.

Figure 6:
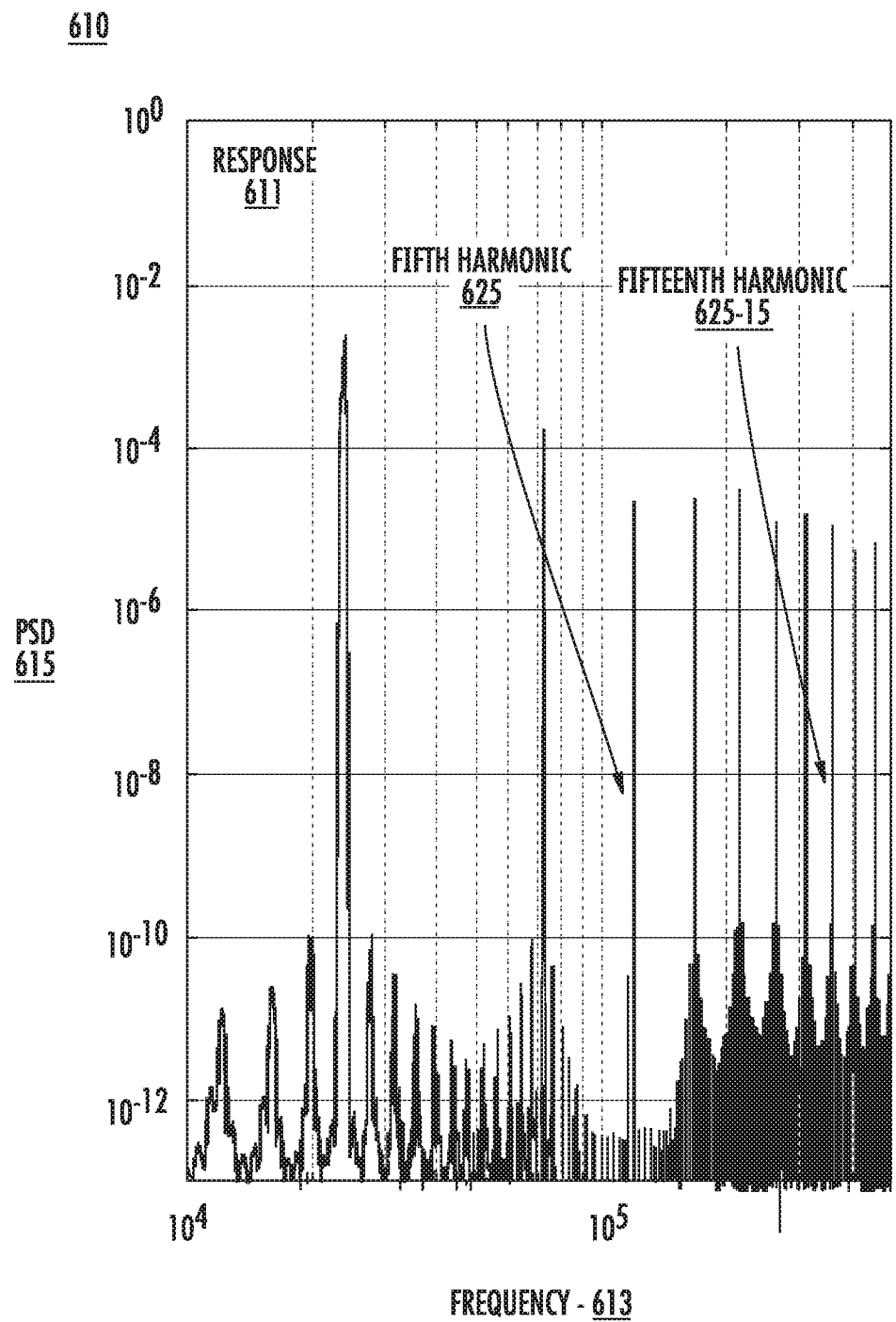
FIGS. 6-7 illustrate a fifth and a sixth, respectively, example response of a MEMS mirror system to example voltage waveforms.

Turning more particularly to FIG. 6, plot 610 is illustrated. The plot 610 depicts a response 611. The response 611 is depicted using PSD 615 in decibels (db) on the y-axis and frequency in Hertz 613 on the x-axis. The response 611 may correspond to a response of the MEMS mirror system 120 to actuation by a modified square wave voltage waveform, such as, for example, a square wave voltage waveform with a tri-state, as described herein. The mirror 124 may resonate as a function of frequency 613, which can be represented as the PSD 615. It is worthy to note, the response 611 includes a suppressed fifth harmonic 625. Furthermore, it is worthy to note, the response 611 includes a suppressed fifteenth harmonic 625-15, which is a multiple of the fifth harmonic 625.

Figure 7:
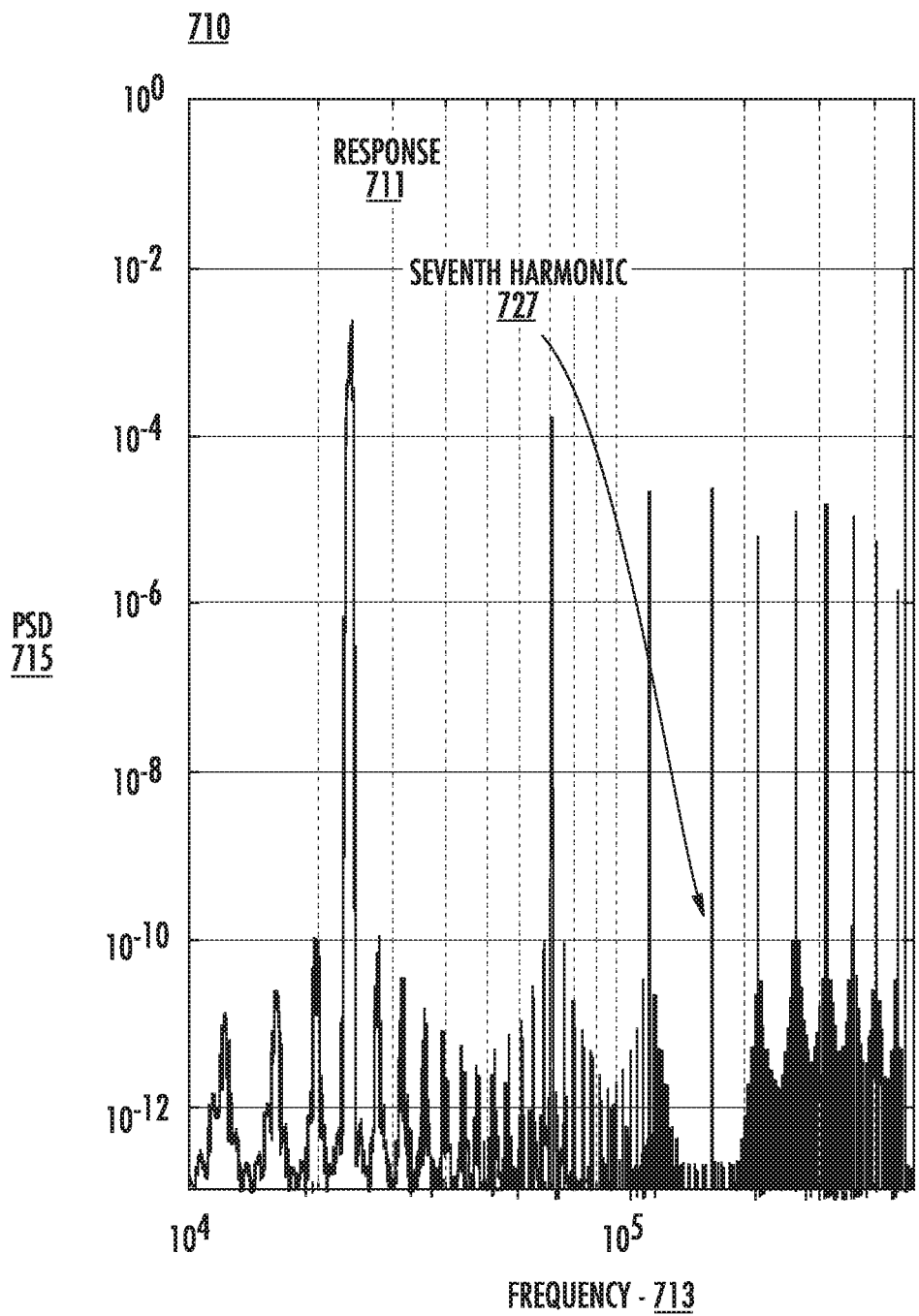

Turning more particularly to FIG. 7, plot 710 is illustrated. The plot 710 depicts a response 711. The response 711 is depicted using PSD 715 in decibels (db) on the y-axis and frequency in Hertz 713 on the x-axis. The response 711 may correspond to a response of the MEMS mirror system 120 to actuation by a modified square wave voltage waveform, such as, for example, a square wave voltage waveform with a tri-state, as described herein. The mirror 124 may resonate as a function of frequency 713, which can be represented as the PSD 715. It is worthy to note, the response 711 includes a suppressed seventh harmonic 727.

FIGS. 8A-8C and 9A-9C illustrate examples to determine when to tri-state and/or attenuate the square wave 201 to form the modified square wave (e.g., the modified square wave 301, the modified square wave 401, the modified square wave 501, or the like). It is worthy to note, in some examples, the modified square wave can be generated by tri-stating and/or attenuating the square wave at a particular time or for a particular duration. In some example, the duration of the tri-state (e.g., the tri-state 331, the tri-state 531, or the like) or the attenuation (e.g., the attenuation 441, the attenuation 541, or the like) can be determined based on the time domain overlap between the modified square wave and a sine wave at the frequency of interest. As used herein, the frequency of interest can correspond to the frequency of the harmonic to be suppressed.

Figure 8A:
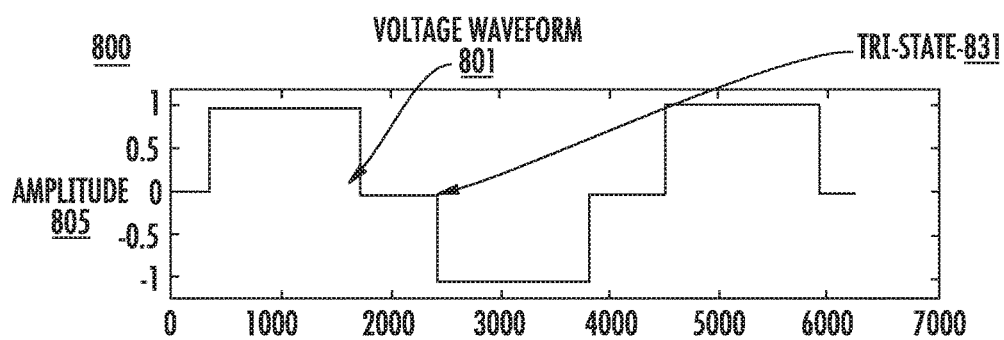
FIGS. 8A-8C illustrate first example voltage waveforms to determine a drive signal to actuate a MEMS mirror system.
Figure 8B:
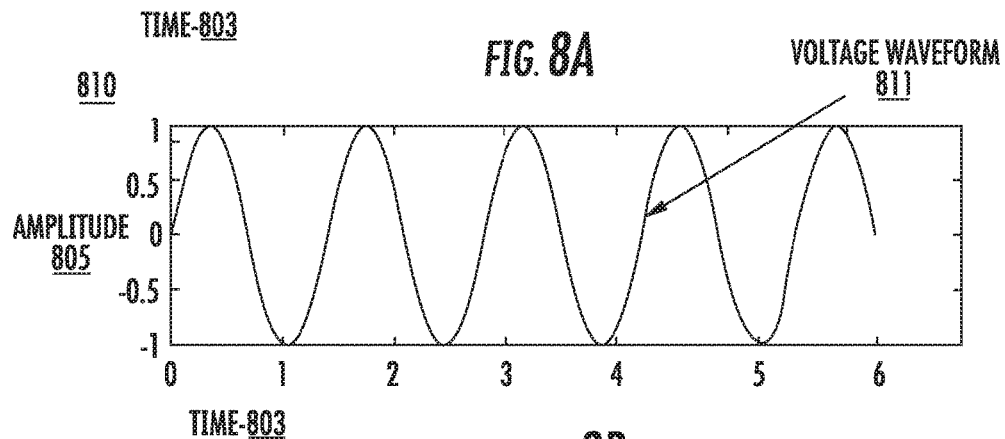

For example, turning more particularly to FIG. 8A and plot 800, which depicts a voltage waveform 801 using amplitude in volts 805 on the y-axis and time in seconds 803 on the x-axis. In some examples, the voltage waveform 801 can be referred to as a modified square wave. In some examples, the drive signal 112 can comprise the voltage waveform 801. During operation, the controller 110 can generate the drive signal 112 to comprise the voltage waveform 801, which may actuate the MEMS mirror system 120. As depicted, the modified square wave includes a tri-state portion 831. The tri-state portion 831 can be configured based in part on overlapping the modified square wave 801 with a sine wave. FIG. 8B illustrates plot 810, which depicts voltage waveform 811, which substantially corresponds to a sine wave.

Figure 8C:
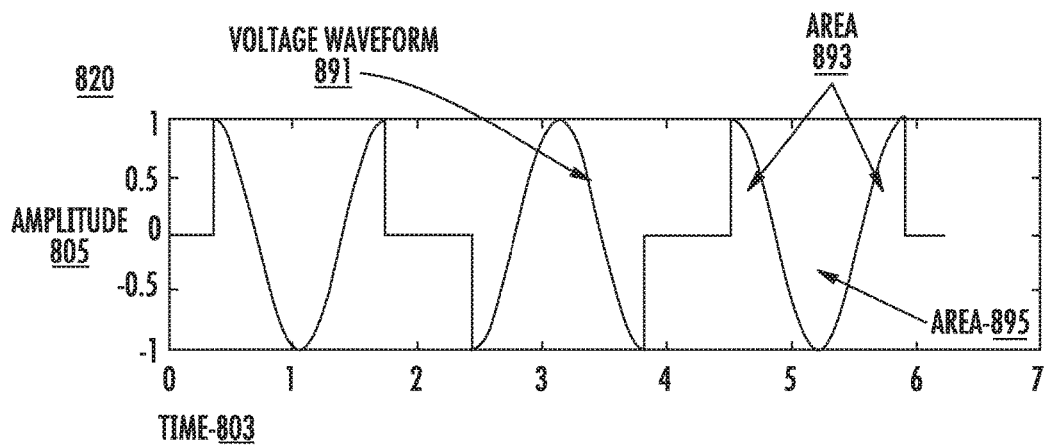

FIG. 8C illustrates plot 820, which depicts a voltage waveform 891. The voltage waveform 891 is depicted using amplitude in volts 805 on the y-axis and time in seconds 803 on the x-axis. In particular, the voltage waveform 891 is a time domain overlap of the voltage waveforms 801 and 811. The voltage waveform 891 is used to illustrate configuring the tri-state 831 of the modified square wave 801 to suppress a desired harmonic. In general, the tri-state portion 831 can be selected such that a whole number of periods of the harmonic to be suppressed are present in any half period of the voltage waveform 801. As such, the signed sum of the surface areas is zero. More specifically, the positive area 893 substantially equals the negative area 895 of the voltage waveform 891.

Figure 9A:
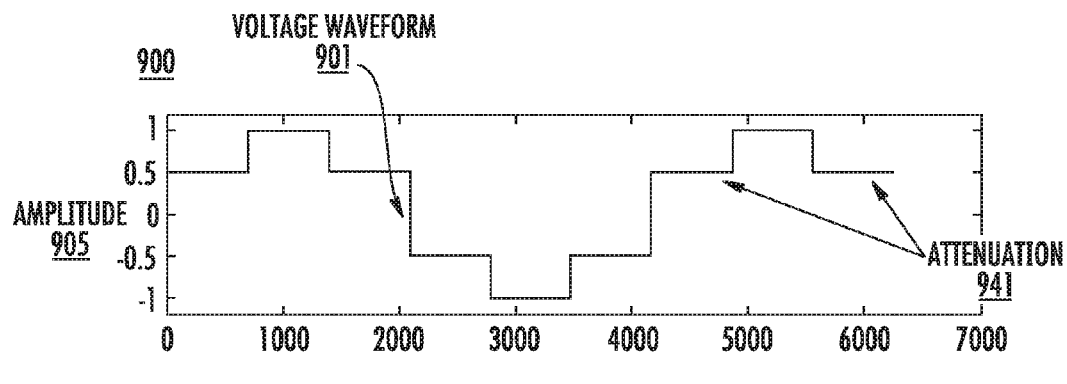
FIGS. 9A-9C illustrate second example voltage waveforms to determine a drive signal to actuate a MEMS mirror system.
Figure 9B:
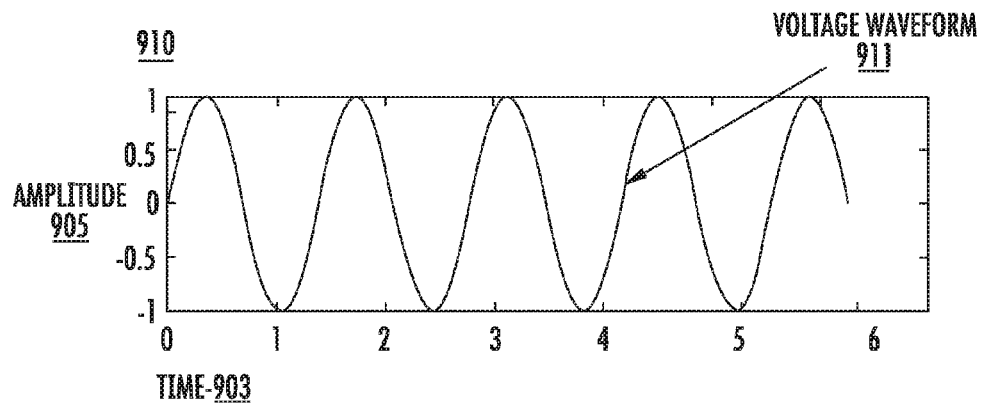

As another example, turning more particularly to FIG. 9A and plot 900, which depicts a voltage waveform 901 using amplitude in volts 905 on the y-axis and time in seconds 903 on the x-axis. In some examples, the voltage waveform 901 can be referred to as a modified square wave. In some examples, the drive signal 112 can comprise the voltage waveform 901. During operation, the controller 110 can generate the drive signal 112 to comprise the voltage waveform 901, which may actuate the MEMS mirror system 120. As depicted, the modified square wave includes attenuated portions 941. The attenuated portions 941 can be configured based in part on overlapping the modified square wave 901 with a sine wave. FIG. 9B illustrates plot 910, which depicts voltage waveform 911, which substantially corresponds to a sine wave.

Figure 9C:
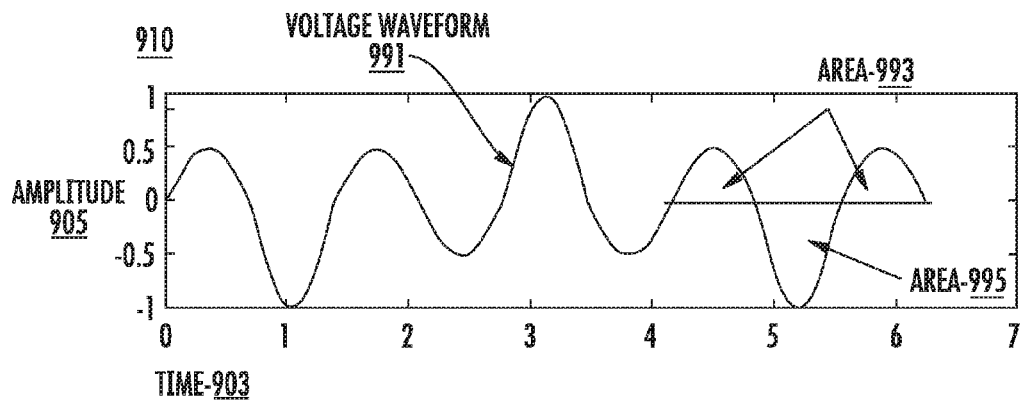

FIG. 9C illustrates plot 920, which depicts a voltage waveform 991. The voltage waveform 991 is depicted using amplitude in volts 905 on the y-axis and time in seconds 903 on the x-axis. In particular, the voltage waveform 991 is a time domain overlap of the voltage waveforms 901 and 911. The voltage waveform 991 is used to illustrate configuring the attenuated portions 941 of the modified square wave 901 to suppress a desired harmonic. In general, the attenuated portions 941 can be selected such that a whole number of periods of the harmonic to be suppressed are present in any half period of the voltage waveform 801. As such, the signed sum of the surface areas is zero. More specifically, the positive area 993 substantially equals the negative area 995 of the voltage waveform 991.

It is worthy to note, while the MEMS mirror could be actuated with a sinusoidal waveform, controllers to generate a sinusoidal waveform typically require complex electronics and typically consume considerable power in the generation circuitry. The present disclosure provides a controller to generate a drive signal comprising a modified square wave to suppress and/or reduce harmonics in the response of the MEMS mirror system to actuation by the modified square wave. As such, simplified waveform generation circuitry and reduced power consumption may be realized.

FIG. 10 illustrates a block diagram of an example controller 1000. In some examples, the controller 1000 can be implemented as the controller 110 of the harmonic suppression system 100 of FIG. 1. The controller 1000 can include a current source 1010, switching assembly 1020, and output port 1030. In general, during operation, the current source 1010 can generate a current while the switching assembly 1020 switches to form a modified square wave (e.g., as described herein) at the output port 1030. In some examples, the switching assembly 1020 can be implemented with a combination of one or more of transistors, operational amplifiers, resistor, capacitors, clocks, or the like.

In some examples, the switching assembly 1020 can comprise various shunt resistances, which can be electrically coupled to the current source 1010 during portion of the period of the modified square wave to tri-state and/or attenuated the modified square wave. In some examples, the switching assembly 1020 can comprise a number of differently weighted resistances, which can be selectively electrically coupled to the current source during operation to tri-state and/or attenuate a modified square wave. In some examples, the switching assembly can be configured to split the current source 1010. In some examples, the current source 1010 can be implemented by a number of current sources to generate a modified square wave as described herein.

Figure 11:
FIG. 11 illustrates a example logic flow.

FIG. 11 illustrates one embodiment of a logic flow 1100. The logic flow 1100 may be representative of some or all of the operations executed by one or more embodiments described herein. In general, the logic flow may be implemented by the controller 110 in generating the drive signal 112 and actuating the MEMS mirror system 120.

The logic flow 1100 may begin at block 1110. At block 1110 "generate a drive signal to include a modified square wave voltage waveform," the controller can generate a modified square wave. For example, the controller can tri-state and/or attenuate a square wave voltage waveform to form a modified square wave and apply the modified square wave as the drive signal 112. In some examples, at block 1110, the controller 110 can generate the modified square waveform 301, the modified square waveform 401, the modified square waveform 501, the modified square waveform 801, or the modified square waveform 901 as the drive signal.

Continuing to block 1120 "apply the drive signal to a MEMS mirror system to actuate the MEMS mirror system," the controller can apply the generated drive signal (e.g., the drive signal 112, or the like) to actuate the EMMS mirror system 120.

Figure 12:
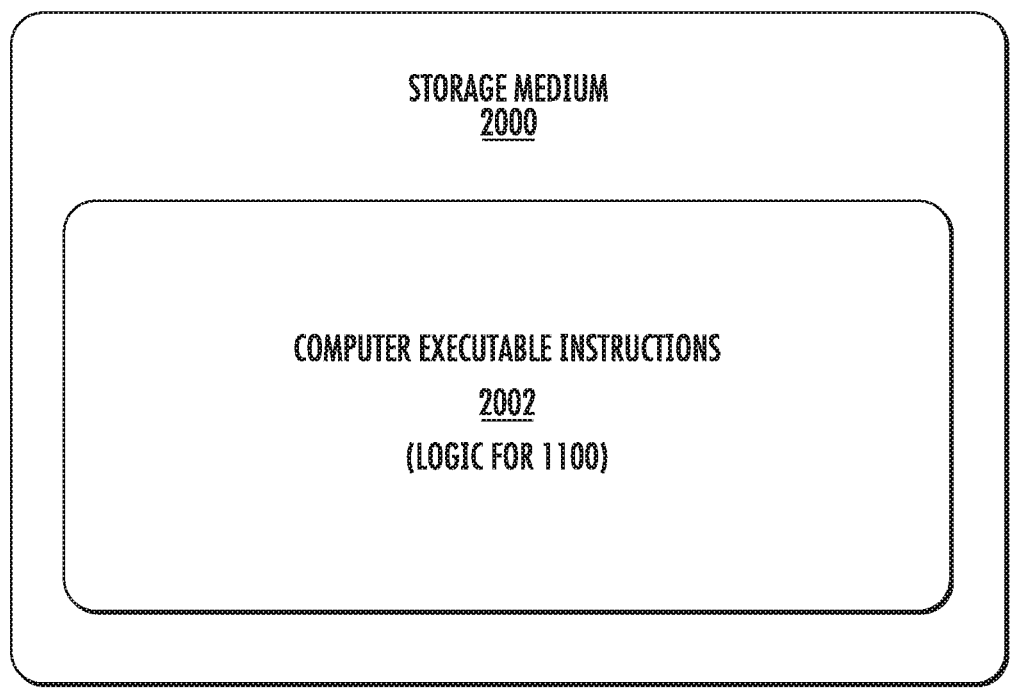
FIG. 12 illustrates an example computer readable medium.

FIG. 12 illustrates an embodiment of a storage medium 1200. The storage medium 1200 may comprise an article of manufacture. In some examples, the storage medium 1200 may include any non-transitory computer readable medium or machine readable medium, such as an optical, magnetic or semiconductor storage. The storage medium 1200 may store various types of computer executable instructions e.g., 1202). For example, the storage medium 1200 may store various types of computer executable instructions to implement the technique corresponding to logic flow 1100.

Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 13:
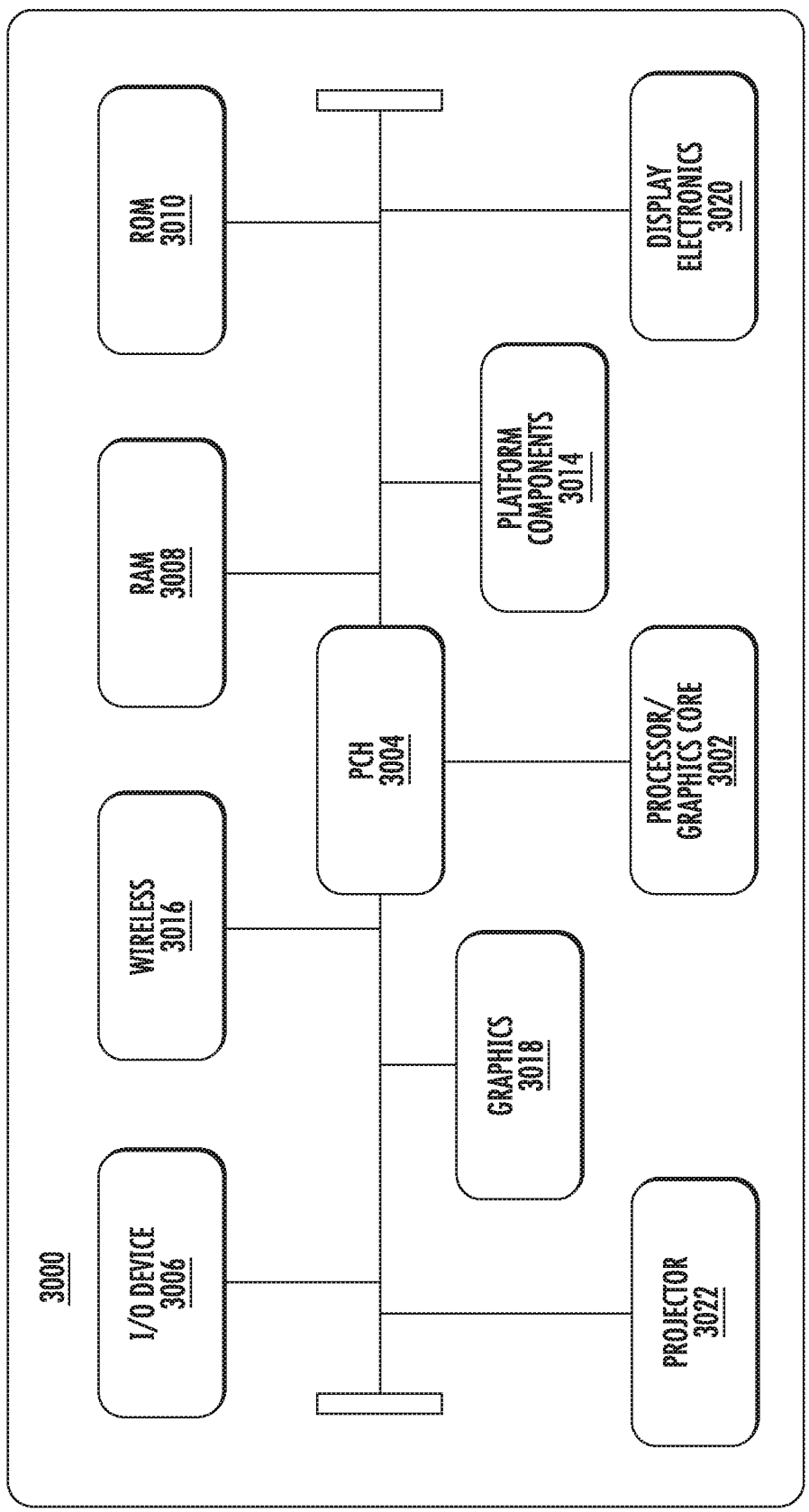
FIG. 13 illustrates an example device.

FIG. 13 is a diagram of an exemplary system embodiment and in particular, depicts a platform 1300, which may include various elements. For instance, this figure depicts that platform (system) 1300 may include a processor/graphics core 1302, a chipset/platform control hub (PCH) 1304, an input/output (I/O) device 1306, a random access memory (RAM) (such as dynamic RAM (DRAM)) 1308, and a read only memory (ROM) 1310, display electronics 1312, projector 1322 (e.g., system 100, or the like), and various other platform components 1314 (e.g., a fan, a cross flow blower, a heat sink, DTM system, cooling system, housing, vents, and so forth). System 1300 may also include wireless communications chip 1316 and graphics device 1318. The embodiments, however, are not limited to these elements.

As depicted, I/O device 1306, RAM 1308, and ROM 1310 are coupled to processor 1302 by way of chipset 1304. Chipset 1304 may be coupled to processor 1302 by a bus 1312. Accordingly, bus 1312 may include multiple lines.

Processor 3002 may be a central processing unit comprising one or more processor cores and may include any number of processors having any number of processor cores. The processor 3002 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 3002 may be multiple separate processors located on separate integrated circuit chips. In some embodiments processor 3002 may be a processor having integrated graphics, while in other embodiments processor 3002 may be a graphics core or cores.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/ or methodologies, but one of ordinary skill in the art may recognize that many further combinations and permutations are possible. Accordingly, the novel architecture is intended to embrace all such alterations, modifications and variations that fall within the spirit and scope of the appended claims. The detailed disclosure now turns to providing examples that pertain to further embodiments. The examples provided below are not intended to be limiting.

Example 1

An apparatus, comprising: a microelectromechanical system (MEMS) mirror system; and a controller to generate a drive signal to actuate the MEMS mirror system, the controller to modify the drive signal to reduce at least one harmonic resonance of the MEMS mirror system.

Example 2

The apparatus of example 1, the controller comprising: a current source to generate a current; and a switching assembly electrically coupled to the current source, the switching assembly to receive the current and to generate the drive signal based on the current.

Example 3

The apparatus of example 2, wherein the drive signal is a periodic voltage waveform.

Example 4

The apparatus of example 3, wherein the drive signal is a modified square wave voltage waveform.

Example 5

The apparatus of example 4, the switching assembly to: generate a square wave voltage waveform; and attenuate at least a portion of the square wave voltage waveform to form the drive signal.

Example 6

The apparatus of example 4, the switching assembly to: generate a square wave voltage waveform; and tri-state at least a portion of the square wave voltage waveform to form the drive signal.

Example 7

The apparatus of example 4, the switching assembly to: generate a square wave voltage waveform; tri-state at least a first portion of the square wave voltage waveform; attenuate at least a second portion of the square wave voltage waveform; and output the tri-stated and attenuated voltage waveform as the drive signal.

Example 8

The apparatus of example 1, the MEMS mirror system comprising: a motor operably coupled to the controller; and a mirror operably coupled to the motor.

Example 9

The apparatus of example 8, the controller to apply the drive signal to the motor to actuate the motor to rotate the mirror about at least one axis.

Example 10

The apparatus of example 9, wherein the mirror is a two-dimensional (2D) mirror to rotate about a first axis and a second axis different than the first axis.

Example 11

A system comprising: a microelectromechanical system (MEMS) mirror system; a controller to generate a drive signal to actuate the MEMS mirror system, the controller to modify the drive signal to reduce at least one harmonic resonance of the MEMS mirror system; a light source optically coupled to the MEMS mirror system, the light source to emit light beams to be received by the MEMS mirror system; and a projection surface optically coupled to the MEMS mirror system, the MEMS mirror to reflect and scan the light beams across the projection surface in response to actuation by the drive signal.

Example 12

The system of example 11, the controller comprising: a current source to generate a current; and a switching assembly electrically coupled to the current source, the switching assembly to receive the current and to generate the drive signal based on the current.

Example 13

The system of example 12, wherein the drive signal is a periodic voltage waveform.

Example 14

The system of example 13, wherein the drive signal is a modified square wave voltage waveform.

Example 15

The system of example 14, the switching assembly to: generate a square wave voltage waveform; and attenuate at least a portion of the square wave voltage waveform to form the drive signal.

Example 16

The system of example 14, the switching assembly to: generate a square wave voltage waveform; and tri-state at least a portion of the square wave voltage waveform to form the drive signal.

Example 17

The system of example 14, the switching assembly to: generate a square wave voltage waveform; tri-state at least a first portion of the square wave voltage waveform; attenuate at least a second portion of the square wave voltage waveform; and output the tri-stated and attenuated voltage waveform as the drive signal.

Example 18

The system of example 11, the MEMS mirror system comprising: a motor operably coupled to the controller; and a mirror operably coupled to the motor.

Example 19

The system of example 18, the controller to apply the drive signal to the motor to actuate the motor to rotate the mirror about at least one axis.

Example 20

The system of example 19, wherein the mirror is a two-dimensional (2D) mirror to rotate about a first axis and a second axis different than the first axis.

Example 21

The system of any one of examples 11 to 20, comprising a heads up display (HUD) frame, the HUD frame coupled to the MEMS mirror system, the controller, the light source, and the projection surface.

Example 22

The system of example 21, wherein the HUD frame is a glasses frame, a goggles frame, or a helmet frame.

Example 23

A method comprising: providing an electric current; periodically switching the electric current to generate a drive signal to actuate a microelectromechanical system (MEMS) mirror system; and modifying the drive signal to reduce at least one harmonic resonance of the MEMS mirror system.

Example 24

The method of example 23, wherein the drive signal is a periodic voltage waveform.

Example 25

The method of example 24, wherein the drive signal is a modified square wave voltage waveform.

Example 26

The method of example 25, comprising: generating a square wave voltage waveform; and attenuating at least a portion of the square wave voltage waveform to form the drive signal.

Example 27

The method of example 25, comprising: generating a square wave voltage waveform; and tri-stating at least a portion of the square wave voltage waveform to form the drive signal.

Example 28

The method of example 25, comprising: generating a square wave voltage waveform; tri-stating at least a first portion of the square wave voltage waveform; attenuating at least a second portion of the square wave voltage waveform; and outputting the tri-stated and attenuated voltage waveform as the drive signal.

Example 29

The method of example 23, wherein the MEMS mirror system comprises a motor and a mirror operably coupled to the motor, the drive signal to actuate the motor to rotate the mirror about at least one axis.

Example 30

The method of example 29, wherein the mirror is a two-dimensional (2D) mirror to rotate about a first axis and a second axis different than the first axis.

Example 31

An apparatus comprising: a current source to generate an electric current; a switching assembly electrically coupled to the current source, the switching assembly to: receive the electric current generate a periodic voltage waveform based on the electric current; and modify the periodic voltage waveform to generate a drive signal to reduce at least one harmonic resonance of a microelectromechanical system (MEMS) mirror system; and an output port electrically coupled to the switching assembly, the output port to receive the drive signal and to apply the drive signal to the MEMS mirror system to actuate the MEMS mirror system.

Example 32

The apparatus of example 31, wherein the drive signal is a modified square wave voltage waveform.

Example 33

The apparatus of example 31, the switching assembly to attenuate at least a portion of the periodic voltage waveform to form the drive signal.

Example 34

The apparatus of example 31, the switching assembly to tri-state at least a portion of the periodic voltage waveform to form the drive signal.

Example 35

The apparatus of example 31, the switching assembly to: tri-state at least a first portion of the periodic voltage waveform; attenuate at least a second portion of the periodic voltage waveform; and output the tri-stated and attenuated periodic voltage waveform as the drive signal.

What is claimed is:

1. An apparatus, comprising:
   a microelectromechanical system (MEMS) mirror system; and
   a controller to generate a drive signal to actuate the MEMS mirror system, the controller to modify the drive signal to reduce at least one harmonic in a response of the MEMS mirror system to actuation by the drive signal.

2. The apparatus of claim 1, the controller comprising:
a current source to generate a current; and
a switching assembly electrically coupled to the current source, the switching assembly to receive the current and to generate the drive signal based on the current.

3. The apparatus of claim 2, wherein the drive signal is a periodic voltage waveform.

4. The apparatus of claim 3, wherein the drive signal is a modified square wave voltage waveform.

5. The apparatus of claim 4, the switching assembly to:
generate a square wave voltage waveform; and
attenuate at least a portion of the square wave voltage waveform to form the drive signal.

6. The apparatus of claim 4, the switching assembly to:
generate a square wave voltage waveform; and
tri-state at least a portion of the square wave voltage waveform to form the drive signal.

7. The apparatus of claim 4, the switching assembly to:
generate a square wave voltage waveform;
tri-state at least a first portion of the square wave voltage waveform;
attenuate at least a second portion of the square wave voltage waveform; and
output the tri-stated and attenuated voltage waveform as the drive signal.

8. The apparatus of claim 1, the MEMS mirror system comprising:
a motor operably coupled to the controller; and
a mirror operably coupled to the motor.

9. The apparatus of claim 8, the controller to apply the drive signal to the motor to actuate the motor to rotate the mirror about at least one axis.

10. The apparatus of claim 9, wherein the mirror is a two-dimensional (2D) mirror to rotate about a first axis and a second axis different than the first axis.

11. A system comprising:
a microelectromechanical system (MEMS)mirror system;
a controller comprising:
a current source to generate a current; and
a switching assembly electrically coupled to the current source, the switching assembly to receive the current and to generate a drive signal to actuate the MEMS mirror system based on the current, the drive signal to reduce at least one harmonic in a response of the MEMS mirror system to actuation by the drive signal;
a light source optically coupled to the MEMS mirror system, the light source to emit light beams to be received by the MEMS mirror system; and
a projection surface optically coupled to the MEMS mirror system, the MEMS mirror to reflect and scan the light beams across the projection surface in response to actuation by the drive signal.

12. The system of claim 11, wherein the drive signal is a modified square wave voltage waveform.

13. The system of claim 12, the switching assembly to:
generate a square wave voltage waveform; and
attenuate at least a portion of the square wave voltage waveform to form the drive signal.

14. The system of claim 12, the switching assembly to:
generate a square wave voltage waveform; and
tri-state at least a portion of the square wave voltage waveform to form the drive signal.

15. The system of claim 12, the switching assembly to:
generate a square wave voltage waveform;
tri-state at least a first portion of the square wave voltage waveform;
attenuate at least a second portion of the square wave voltage waveform; and
output the tri-stated and attenuated voltage waveform as the drive signal.

16. The system of claim 11, comprising a heads up display (HUD) frame, the HUD frame coupled to the MEMS mirror system, the controller, the light source, and the projection surface.

17. The system of claim 16, wherein the HUD frame is a glasses frame, a goggles frame, or a helmet frame.

18. A method comprising:
providing an electric current;
periodically switching the electric current to generate a drive signal to actuate a microelectromechanical system (MEMS) mirror system; and
modifying the drive signal to reduce at least one harmonic in a response of the MEMS mirror system to actuation by the drive signal.

19. The method of claim 18, wherein the drive signal is a modified square wave voltage waveform.

20. The method of claim 18, comprising:
generating a square wave voltage waveform;
modifying the square wave voltage waveform based at least in part on one or more of tri-stating or attenuating a portion of the square wave voltage waveform;
outputting the modified square wave voltage waveform as the drive signal.

21. An apparatus comprising:
a current source to generate an electric current;
a switching assembly electrically coupled to the current source, the switching assembly to:
receive the electric current
generate a periodic voltage waveform based on the electric current; and
modify the periodic voltage waveform to generate a drive signal to reduce at least one harmonic in a response of a microelectromechanical system (MEMS) mirror system to actuation by the drive signal; and
an output port electrically coupled to the switching assembly, the output port to receive the drive signal and to apply the drive signal to the MEMS mirror system to actuate the MEMS mirror system.

22. The apparatus of claim 21, wherein the drive signal is a modified square wave voltage waveform.

23. The apparatus of claim 21, the switching assembly to attenuate at least a portion of the periodic voltage waveform to form the drive signal.

24. The apparatus of claim 21, the switching assembly to tri-state at least a portion of the periodic voltage waveform to form the drive signal.

25. The apparatus of claim 21, the switching assembly to:
tri-state at least a first portion of the periodic voltage waveform;
attenuate at least a second portion of the periodic voltage waveform; and
output the tri-stated and attenuated periodic voltage waveform as the drive signal.

* * * * *